United States Patent [19]
Lou

[11] Patent Number: 6,020,265
[45] Date of Patent: Feb. 1, 2000

[54] METHOD FOR FORMING A PLANAR INTERMETAL DIELECTRIC LAYER

[75] Inventor: Chine-Gie Lou, Hsinchu Hsien, Taiwan

[73] Assignee: Worldwide Semiconductor Manufacturing Corporation, Hsinchu, Taiwan

[21] Appl. No.: 09/085,321

[22] Filed: May 26, 1998

[51] Int. Cl.[7] ........................ H01L 21/302; H01L 21/311; B05D 5/12; B05D 3/02; B05D 1/36

[52] U.S. Cl. ........................ 438/692; 438/694; 438/697; 427/126.3; 427/387; 427/402

[58] Field of Search ..................... 438/692, 694, 438/697; 427/126.3, 387, 402

[56] References Cited

U.S. PATENT DOCUMENTS 5,312,512   5/1994   Allman et al. ........................... 156/636

Primary Examiner—Steven P. Griffin
Assistant Examiner—Maribel Medina
Attorney, Agent, or Firm—Blakely Sokoloff Taylor & Zafman

[57] ABSTRACT

A method of forming a planar intermetal dielectric layer over conductive metal structures is disclosed. The method comprises the steps of: forming a liner oxide layer over the conductive metal structures; forming a cured low dielectric material layer over the liner oxide layer; forming an uncured low dielectric material layer over the cured low dielectric material layer; forming an uncured siloxane layer over the uncured low dielectric material layer; performing a chemical mechanical polishing (CMP) on the uncured siloxane layer and the uncured low dielectric material layer, said CMP stopping at a surface of the cured low dielectric material layer thereby leaving a remaining portion of the uncured low dielectric material layer in a spacing of the conductive metal structures; curing the remaining portion of the uncured low dielectric material layer; and forming a cap oxide layer over the cured low dielectric material layer and the cured remaining portion.

5 Claims, 1 Drawing Sheet

METHOD FOR FORMING A PLANAR INTERMETAL DIELECTRIC LAYER

FIELD OF THE INVENTION

The present invention generally relates to semiconductor manufacturing processes, and more particularly, to a method for forming a planar intermetal dielectric layer.

BACKGROUND OF THE INVENTION

Intermetal dielectric layers are commonly used to isolate conducting structures, such as metal layers, from subsequently deposited conducting layers. Intermetal dielectric layers are also useful in performing a planarization function. Typical prior art processes for forming an intermetal dielectric layer consist of depositing multiple layers of oxide over the underlying metal layer.

In one typical prior art process, a thick liner oxide composed of silicon dioxide first covers the metal layer, followed by a low dielectric material layer that is baked and cured. A chemical mechanical polishing (CMP) is performed on the cured low dielectric material layer. A second silicon dioxide layer completes the intermetal dielectric layer. A planarization process, such as CMP, is performed to improve the global planarization of the intermetal dielectric layer. The multiple layers of oxide are then patterned and etched to form via holes through to the underlying metal layer.

This prior art method for forming an intermetal dielectric layer presented many problems. The removal rate of the low dielectric material layer during CMP is very low. Endpoint detection is not available. In addition, the intermetal capacitance is high due to the thick liner oxide.

Another prior art process involves the same steps as the first prior art process discussed immediately above except the step of CMP on the cured low dielectric material layer is omitted. This prior art method also presented many problems. Similar to the first prior art process discussed above, endpoint detection is not available. In addition, this prior art process raises poisoned via concerns. Furthermore, the low dielectric material is present on the top of the conducting structures because CMP is not performed on the cured low dielectric material layer, and the thermal conductivity of the low dielectric material is low.

What is needed is a method for forming a planarized intermetal dielectric layer that eliminates the aforementioned problems.

SUMMARY OF THE INVENTION

A method of forming a planar intermetal dielectric layer over conductive metal structures is disclosed. The method comprises the steps of: forming a liner oxide layer over the conductive metal structures; forming a cured low dielectric material layer over the liner oxide layer; forming an uncured low dielectric material layer over the cured low dielectric material layer; forming an uncured siloxane layer over the uncured low dielectric material layer; performing a chemical mechanical polishing (CMP) on the uncured siloxane layer and the uncured low dielectric material layer, said CMP stopping at a surface of the cured low dielectric material layer thereby leaving a remaining portion of the uncured low dielectric material layer in a spacing of the conductive metal structures; curing the remaining portion of the uncured low dielectric material layer; and forming a cap oxide layer over the cured low dielectric material layer and the cured remaining portion.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
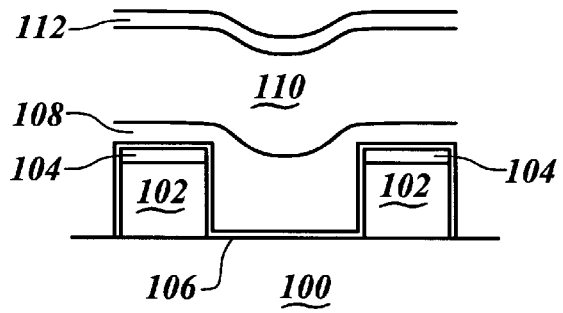
FIGS. 1–3 are cross-sectional views of a semiconductor substrate illustrating the steps of the present invention.

Turning to FIG. 1, a substrate 100 has a plurality of conductive structures 102 formed thereon. The term "substrate" is understood to possibly include a semiconductor wafer, active and passive devices formed within the wafer, and layers formed on the wafer's surface. Thus, the term "substrate" is meant to include devices formed within a semiconductor wafer and the layers overlying the wafer.

The conductive structures 102 are typically metal interconnects or any other conductive structure. Additionally, the conductive structures 102 have a thin anti-reflective coating (ARC) 104 located atop the conducting structures 102. The ARC may be titanium nitride, for example. The use of the ARC 104 atop the conducting structures 102 is well-known in the art. Further, it can be appreciated that the conductive structures 102 shown are merely exemplary and not meant to be limiting.

In accordance with the present invention, as a first step, a liner oxide layer 106 is deposited over the substrate 100 and the conducting structures 102. The liner oxide layer 106 is preferably silicon dioxide, has a thickness of about 300 to 800 angstroms, and is preferably formed using a conventional plasma-enhanced chemical vapor deposition (PECVD) technique. The liner oxide layer 106 serves the purpose of providing a high quality insulator directly over and in immediate contact with conducting structures.

Next, a first layer of low dielectric material 108 is coated onto the liner oxide layer 106 using conventional techniques, such as spin on glass (SOG) coater. The first low dielectric material layer 108 is preferably about 800 to 2000 angstroms thick. The first low dielectric material layer 108 is cured to reduce moisture absorption during subsequent stripping of a photoresist layer used in subsequent masking and etching of oxide layers and to remove solvent in the SOG film. The curing process is well-known and thus, will not be discussed further herein.

Next, a second layer of low dielectric material 110 is coated onto the first low dielectric material layer 108 by conventional techniques, such as SOG coater. The second low dielectric material layer 110 is preferably about 2000 to 8000 angstroms. The second low dielectric material layer 110 is uncured at this time.

Next, a siloxane layer 112 is coated onto the second low dielectric material layer 110 by a conventional technique, such as SOG coater. The siloxane layer 112 is uncured and is preferably about 1000 to 2000 angstroms. The siloxane layer 112 reduces the dishing effect of subsequent chemical mechanical polishing (CMP).

Figure 2:
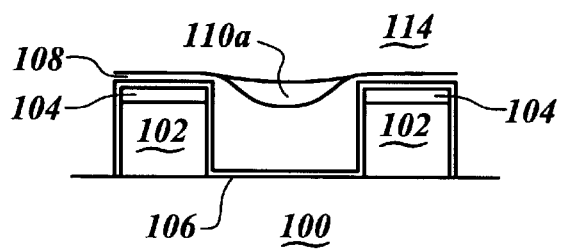

Turning to FIG. 2, an oxide CMP is performed and controlled to stop at the surface of the first low dielectric material layer 108. A conventional silica base slurry may be used. The removal rate of uncured low dielectric material is 3900 angstroms/minute, while the removal rate of cured low dielectric material is 200 angstroms/minute. Because the ratio of the removal rate of uncured low dielectric material to the removal rate of cured low dielectric material is almost 20 to 1, endpoint detection is available. After the CMP is complete, a remaining portion of the uncured low dielectric material layer 110a is cured using conventional furnace curing.

Figure 3:
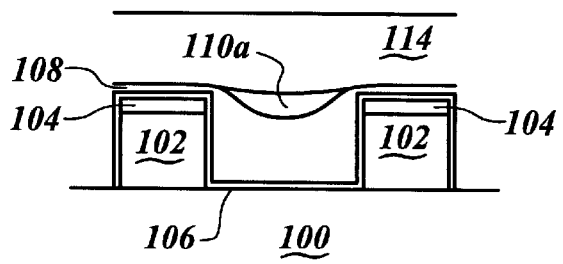

Turning to FIG. 3, a cap oxide layer 114 is deposited, preferably by using a PECVD technique. The cap oxide layer 114 is preferably silicon dioxide and is about 2000 to 8000 angstroms. The cap oxide layer 114 provides a high quality insulator directly in contact with subsequently deposited conducting layers. The formation of the planar intermetal dielectric layer is complete.

In addition to making endpoint detection available, the method for forming an intermetal dielectric layer according to the present invention presents many advantages. The intermetal capacitance is lower due to the thin liner oxide in the present invention. In the first prior art method discussed above, the liner oxide acted as a CMP stop layer and thus, had to be thick to protect the conductive structures 102. Additionally, the removal rate of the low dielectric material is very high, 3900 angstroms/minute, in the present invention compared to the prior art method in which the removal rate of the low dielectric material is only 200 angstroms/minute because the low dielectric material is cured after the CMP in the present invention. Also, dishing of the intermetal dielectric layer is improved by the siloxane layer 112 because the removal rate of the uncured siloxane layer 112 is 2000 angstroms/minute. Poison via is reduced and the thermal conductivity of the intermetal dielectric layer is improved through the CMP of the low dielectric material layer. Furthermore, the top surface of the intermetal dielectric layer is scratch-free through the deposition of the cap oxide layer 114 after the CMP.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a planar intermetal dielectric layer over conductive metal structures, the method comprising the steps of:

forming a liner oxide layer over the conductive metal structures;

forming a cured low dielectric material layer over the liner oxide layer;

forming an uncured low dielectric material layer over the cured low dielectric material layer;

forming an uncured siloxane layer over the uncured low dielectric material layer;

performing a chemical mechanical polishing (CMP) on the uncured siloxane layer and the uncured low dielectric material layer, said CMP stopping at a surface of the cured low dielectric material layer thereby leaving a remaining portion of the uncured low dielectric material layer in a spacing of the conductive metal structures;

curing the remaining portion of the uncured low dielectric material layer; and forming a cap oxide layer over the cured low dielectric material layer and the cured remaining portion.

2. The method of claim 1 wherein the liner oxide layer is about 300 to 800 angstroms.

3. The method of claim 1 wherein the cured low dielectric material layer is about 800 to 2000 angstroms.

4. The method of claim 1 wherein the uncured low dielectric material layer is about 2000 to 8000 angstroms.

5. The method of claim 1 wherein the uncured siloxane layer is about 1000 to 2000 angstroms.

* * * * *